(12) United States Patent
Kobayashi

(10) Patent No.: US 9,369,095 B2
(45) Date of Patent: Jun. 14, 2016

(54) UNBALANCED LINEAR POWER AMPLIFIER

(71) Applicant: RF Micro Devices, Inc., Greensboro, NC (US)

(72) Inventor: Kevin Wesley Kobayashi, Redondo Beach, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/606,375

(22) Filed: Jan. 27, 2015

(65) Prior Publication Data

US 2015/0214909 A1 Jul. 30, 2015

Related U.S. Application Data

(60) Provisional application No. 61/931,895, filed on Jan. 27, 2014.

(51) Int. Cl.
| | | |
|---|---|---|
| *H03F 3/68* | (2006.01) | |
| *H01Q 11/12* | (2006.01) | |
| *H03F 1/56* | (2006.01) | |
| *H03F 1/32* | (2006.01) | |
| *H03F 1/02* | (2006.01) | |
| *H03F 3/60* | (2006.01) | |

(52) U.S. Cl.
CPC ............... *H03F 1/56* (2013.01); *H03F 1/0261* (2013.01); *H03F 1/32* (2013.01); *H03F 1/565* (2013.01); *H03F 3/602* (2013.01); *H03F 2200/192* (2013.01); *H03F 2200/198* (2013.01); *H03F 2200/204* (2013.01); *H03F 2201/3215* (2013.01)

(58) Field of Classification Search
USPC ................ 330/124 R, 295, 305; 455/127.1

IPC ..................................... H03F 3/68; H01Q 11/12
See application file for complete search history.

(56) References Cited

U.S. PATENT DOCUMENTS

| | | | |
|---|---|---|---|
| 4,187,471 A | | 2/1980 | Shimoji et al. |
| 6,208,202 B1 * | | 3/2001 | Kaufman ............... H03F 3/602 |
| | | | 330/151 |

(Continued)

FOREIGN PATENT DOCUMENTS

WO    2014007703 A1    1/2014

OTHER PUBLICATIONS

Non-Final Office Action for U.S. Appl. No. 14/103,089, mailed Sep. 16, 2015, 5 pages.

(Continued)

*Primary Examiner* — Patricia T Nguyen
(74) *Attorney, Agent, or Firm* — Withrow & Terranova, P.L.L.C.

(57) ABSTRACT

An unbalanced linear power amplifier (PA) is disclosed having a quadrature coupler with a 90° phase input port, a 0° phase input port, an output termination port, and a signal output port. Each of the 90° phase input port, the 0° phase input port, the output termination port, and the signal output port have a characteristic resistance (Ro). Also included is a first PA having an output coupled to a 90° phase input port of the quadrature coupler and a second PA having an output coupled to a 0° phase input port of the quadrature coupler. Biasing circuitry provides the first PA and the second PA with a similar gain. A tuning network is coupled between the output termination port and ground. The tuning network has an isolation resistance in series with an isolation inductance, wherein the isolation resistance is between about 0.02*Ro Ω and 0.8*Ro Ω.

32 Claims, 16 Drawing Sheets

(56) References Cited

U.S. PATENT DOCUMENTS

| | | | |
|---|---|---|---|
| 6,262,629 | B1 | 7/2001 | Stengel et al. |
| 6,297,696 | B1 | 10/2001 | Abdollahian et al. |
| 6,864,742 | B2 | 3/2005 | Kobayashi |
| 7,064,606 | B2 | 6/2006 | Louis |
| 7,345,535 | B2 | 3/2008 | Kwon et al. |
| 7,570,932 | B1 | 8/2009 | Folkmann |
| 8,314,654 | B2 * | 11/2012 | Outaleb ............... H03F 1/0288 330/124 R |
| 8,346,189 | B2 | 1/2013 | Dupuy et al. |
| 8,417,201 | B1 * | 4/2013 | Schooley ............... H04B 1/006 455/127.4 |
| 8,508,296 | B1 * | 8/2013 | Mustafa ............... H03F 1/565 330/124 R |
| 8,564,367 | B2 | 10/2013 | Svechtarov |
| 8,593,219 | B1 | 11/2013 | Root |
| 8,970,297 | B2 | 3/2015 | Lin et al. |
| 2002/0186079 | A1 | 12/2002 | Kobayashi |
| 2004/0095190 | A1 * | 5/2004 | Klaren ............... H03F 3/602 330/124 R |
| 2005/0134377 | A1 | 6/2005 | Dent |
| 2006/0121873 | A1 * | 6/2006 | Ammar ............... G01K 11/006 455/326 |

OTHER PUBLICATIONS

Non-Final Office Action for U.S. Appl. No. 14/314,357, mailed Sep. 21, 2015, 19 pages.

Final Office Action for U.S. Appl. No. 14/103,089, mailed May 22, 2015, 5 pages.

Choi, Jinsung, et al., "Optimized Envelope Tracking Operation of Doherty Power Amplifier for High Efficiency Over an Extended Dynamic Range," IEEE Transactions on Microwave Theory and Techniques, vol. 57, No. 6, Jun. 2009, pp. 1508-1515.

Doherty, W.H., "A New High Efficiency Power Amplifier for Modulated Waves," Proceedings of the Institute of Radio Engineers, vol. 24, No. 9, Sep. 1936, pp. 1163-1182.

Gustafsson, David, et al., "A Novel Wideband and Reconfigurable High Average Efficiency Power Amplifier," 2012 IEEE MTT-S International Microwave Symposium Digest, Jun. 17-22, 2012, pp. 1-3.

Jeon, Hamhee, et al., "A Triple-Mode Balanced Linear CMOS Power Amplifier Using a Switched-Quadrature Coupler," IEEE Journal of Solid-State Circuits, vol. 47, No. 9, Sep. 2012, pp. 2019-2032.

Lange, J., "Interdigitated Stripline Quadrature Hybrid," IEEE Transactions on Microwave Theory and Techniques, vol. 17, No. 12, Dec. 1969, pp. 1150-1151.

Mohamed, A.M.M., et al., "Reconfigurable Doherty Amplifier for Efficient Amplification of Signals with Variable PAPR," 2013 IEEE MTT-S International Microwave Symposium Digest (IMS), Jun. 2-7, 2013, pp. 1-3.

Non-Final Office Action for U.S. Appl. No. 14/103,089, mailed Mar. 24, 2015, 6 pages.

Notice of Allowance of U.S. Appl. No. 14/103,089, mailed Jan. 8, 2016, 7 pages.

Non-Final Office Action for U.S. Appl. No. 14/501,453, mailed Dec. 4, 2015, 11 pages.

Notice of Allowance for U.S. Appl. No. 14/103,089, mailed Mar. 18, 2016, 6 pages.

* cited by examiner

UNBALANCED LINEAR POWER AMPLIFIER

RELATED APPLICATIONS

This application claims the benefit of provisional patent application Ser. No. 61/931,895, filed Jan. 27, 2014, the disclosure of which is hereby incorporated herein by reference in its entirety.

FIELD OF THE DISCLOSURE

The present disclosure relates to RF amplifiers used in wireless communications equipment, and in particular to linear broadband power amplifiers.

BACKGROUND

Wireless communications equipment typically employs RF amplifiers for increasing RF power during signal transmission. Particular classes of amplification rely on linear amplifiers. Linearity for broadband amplifiers having a bandwidth greater than about 20% is relatively strict.

An indirect measure of linearity is error vector magnitude (EVM), which is typically given in percent or decibels (dB). According to the ETSI TR 290 V1.31 (2014 July), one formula for EVM in percent is:

$$EVM_{RMS} = \sqrt{\frac{\frac{1}{N}\sum_{j=1}^{N}(\delta I_j^2 + \delta Q_j^2)}{S_{max}^2}} \times 100\% \quad (EQ.\ 1)$$

Where I and Q are ideal coordinates and, $\delta I$ and $\delta Q$ are the errors in the received data points, and N is the number of data points in a measurement sample. $S_{max}$ is the magnitude for a vector to the outermost state of the constellation.

In this regard, it is desirable to combine two power amplifiers (PAs) to increase linear output power by at least 3 dB without compromising bandwidth or linear efficiency. Additionally, it is further desirable to reduce the EVM percent at the at least 3 dB higher power level.

What is needed is a 3 dB or better linear power amplifier that combines two PAs without compromising bandwidth or linear efficiency versus a single amplifier configuration. Moreover, a need exists for at least a 4 dB EVM linearity improvement across a greater than 20% bandwidth.

SUMMARY

An unbalanced linear power amplifier (PA) is disclosed, having a quadrature coupler with a 90° phase input port, a 0° phase input port, an output termination port, and a signal output port. Each of the 90° phase input port, the 0° phase input port, the output termination port, and the signal output port have a characteristic resistance (Ro). Also included is a first power amplifier having an output coupled to a 90° phase input port of the quadrature coupler and a second PA having an output coupled to a 0° phase input port of the quadrature coupler. Biasing circuitry provides the first PA and the second PA with a similar gain. A tuning network is coupled between the output termination port and ground. The tuning network has an isolation inductance and an isolation resistance in series with the isolation inductance, wherein the isolation resistance is between about 0.02*Ro Ω and 0.8*Ro Ω. The unbalanced configuration provides a means of linearizing the broadband PA performance.

In at least one exemplary embodiment, the tuning network is dynamically tunable with a controller that dynamically tunes the tuning network based upon a given frequency of the output signal. In at least another exemplary embodiment, a second quadrature coupler having a 0° phase output port coupled to an input port of the first PA, and a 90° phase output port coupled to an input port of the second PA, an input termination port, and a signal input port for receiving an input signal. A second tuning network coupled between the input termination port and ground has a second isolation resistance in series with a second isolation inductance, wherein the second isolation resistance is between about 0.02*Ro Ω and 0.8*Ro Ω. In yet another exemplary embodiment, the controller is further configured to tune the second tuning network.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Embodiments of the present disclosure provide a 3 dB or better unbalanced linear power amplifier (PA) that combines two PAs without compromising bandwidth or efficiency versus a single amplifier configuration, while also providing at least a 4 dB error vector magnitude (EVM) linearity improvement across a greater than 20% bandwidth. In particular, embodiments of the present disclosure provide orthogonal (independent) linear power tuning of a low-band (LB) edge versus a high-band (HB) edge of a broadband PA with a bandwidth that is greater than 20%. In other words, embodiments of the present disclosure provide band edge linear PA compensation. In general, the present embodiments employ orthogonality with resistance-inductance (R-L) termination(s) to minimize EVM for both HB and LB operation. The orthogonality is realized by taking advantage of unique quadrature impedance transformation properties to linearize power performance without significantly compromising bandwidth or linear efficiency. Another measurement closely associated with linearity is signal-to-noise ratio (SNR). Typically, increasing linearity increases SNR. Thus, maximizing SNR also typically maximizes linearity and vice versa.

Figure 1:
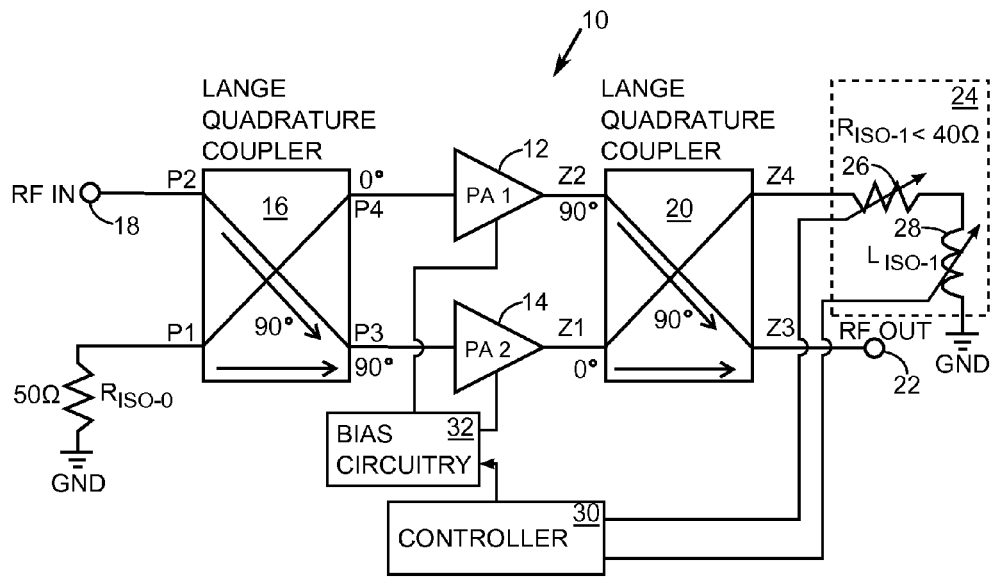
FIG. 1 is a schematic diagram of a first embodiment of an unbalanced linear power amplifier (PA).

FIG. 1 is a schematic diagram of a first embodiment of an unbalanced linear power amplifier 10. In particular, the unbalanced linear power amplifier 10 includes a first PA 12 and a second PA 14 that are similarly biased in a similar class of operation. For example, the first PA 12 and second PA 14 can both be biased for either class A or class AB. However, the present embodiments are not configured for Doherty operation. A first quadrature coupler 16 has an input termination port P1, a signal input port P2 for receiving an input signal, a 90° phase output port P3, and a 0° phase output port P4 that each have a characteristic impedance (Zo) comprising a characteristic resistance (Ro). An RF input terminal 18 is coupled to the signal input port P2. A fixed input isolation resistor $R_{ISO-0}$ is coupled to the input termination port P1. The 0° phase output port P4 is coupled to an input of the first PA 12, whereas the 90° phase output port P3 is coupled to an input of the second PA 14.

A second quadrature coupler 20 has a 0° phase input port Z1, a 90° phase input port Z2, a signal output port Z3, and an output termination port Z4, each having the characteristic impedance Zo comprising the characteristic resistance Ro. An RF output terminal 22 is coupled to the signal output port Z3 that provides an output signal. An output of the first PA 12 is coupled to the 90° phase input port Z2, whereas an output of the second PA 14 is coupled to the 0° phase input port Z1.

A tuning network 24 is coupled between the output termination port Z4 and a fixed voltage node such a ground (GND). The tuning network 24 comprises an output isolation resistance $R_{ISO-1}$ that is coupled in series to an output isolation inductance $L_{ISO-1}$.

In at least one embodiment, the first quadrature coupler 16 and the second quadrature coupler 20 are broadband quadrature type couplers such as a Lange coupler to provide broadband power combining. The first PA 12 and the second PA 14 are biased for linear output power performance across a substantially broad bandwidth. A return-loss match may not be ideal for either of the first PA 12 or the second PA 14. However, in such a case, the return-loss match is correctable by configuring the first quadrature coupler 16 as a quadrature divider at the RF input terminal 18, and by configuring the second quadrature coupler 20 as a quadrature combiner at the RF output terminal 22 based on inherent operation of a quadrature balanced amplifier topology. This assumes that the first PA 12 and the second PA 14 are approximately similar in bias and characteristics.

The present embodiments incorporate the tuning network 24 to create frequency dependent real load impedance that is presented to the first PA 12 and the second PA 14, which is configured for low AM-AM distortion and linear power across a relatively large bandwidth that is greater than 20% of a carrier frequency at the RF input 18. Because of the nature of broadband coupler characteristics associated with the second quadrature coupler 20, the impedance presented to the output termination port Z4, will be limited to a real portion, which in this case is the isolation resistance $R_{ISO}$-1, which is lower than an antenna (not shown) or other load impedance presented to the signal output port Z3 coupled to the RF output terminal 22, which is typically 50Ω. The output isolation resistance $R_{ISO-1}$ should be limited to below system impedance in order for the output isolation inductance $L_{ISO-1}$ to be effective in creating desirable frequency dependent real load impedance to the first PA 12 and the second PA 14 through the 90° phase input port Z2 and the 0° phase input port Z1, respectively.

The tuning network 24 may be a static tuned network during board or module prototype assembly. Real time production tuning can be realized by trimming the output isolation resistance $R_{ISO-1}$ and the output isolation inductance $L_{ISO-1}$ with a laser in order to recover performance loss due to process variations. For example, at 5 GHz, the output isolation resistance $R_{ISO-1}$ may be constructed of a laser trimmable thin film resistor and the output isolation inductance $L_{ISO-1}$ may be constructed of a narrow transmission line that may also be trimmable. A tuning range of the output isolation inductance $L_{ISO-1}$ ranges from about 0.1 nano-Henrys (nH) to about 2 nH, which is a practical range to realize with transmission lines or wirebonds, thus making tuning practical.

In at least one embodiment, the tuning network 24 is dynamically tunable based upon a transmit frequency of operation that is the frequency of the input signal and output signal, which is known a priori. In such a case, a look-up table (LUT) can be implemented after calibrating performance versus frequency of operation. In this regard, a controller 30 is configured to adjust the output isolation resistance $R_{ISO-1}$ provided by a variable output isolation resistor 26 and adjust the output isolation inductance $L_{ISO-1}$ provided by a variable output isolation inductor 28. On-chip variable resistor technologies suitable to realize the variable output isolation resistor 26 include, but are not limited to, a switched resistor array fabricated from microelectromechanical systems (MEMS) technology and a voltage controlled variable resistance using a field effect transistor (FET). An example of on-chip variable inductor technology includes, but is not limited to MEMs technology that adjusts inductive coil dimensions or an array of selectable fixed inductors.

In the exemplary embodiment depicted in FIG. 1, the controller 30 is further configured to adjust bias points of the first PA 12 and the second PA 14 by way of bias circuitry 32 that is digitally controllable. The controller 30 has a digital processor that is programmed to control the bias circuitry 32 such that the bias points cause the first PA 12 and the second PA 14 to have substantially the same gain.

Figure 2:
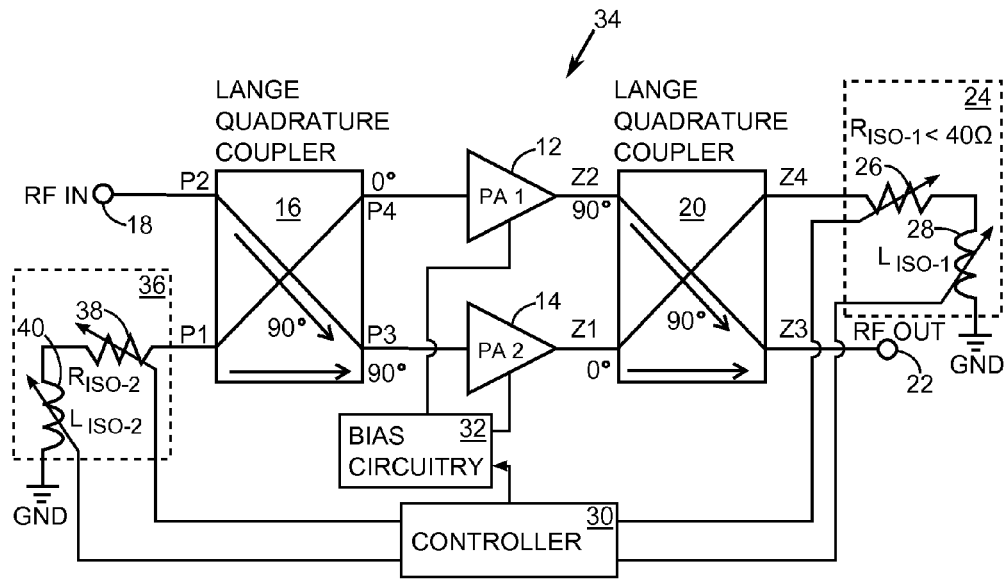
FIG. 2 is a schematic diagram of a second embodiment of an unbalanced linear PA.

FIG. 2 is a schematic diagram of a second embodiment of an unbalanced linear power amplifier 34. In this particular embodiment, a second tuning network 36 is coupled to the input termination port P1. Moreover, the controller 30 is further configured to adjust an input isolation resistance $R_{ISO-2}$ provided by a variable input isolation resistor 38 and to adjust an input isolation inductance $L_{ISO-2}$ provided by a variable input isolation inductor 40.

In at least one exemplary embodiment, the output isolation resistance $R_{ISO-1}$ is between about 0.1Ω and 40Ω, and the output isolation inductance $L_{ISO-1}$ is between about 0.1 nH and 2 nH. It is to be understood that in various exemplary embodiments, the input isolation resistance $R_{ISO-2}$ will have similar ranges of resistance as given above for the output isolation resistance $R_{ISO-1}$. It also is to be understood that in various exemplary embodiments, the input isolation inductance $L_{ISO-2}$ will have similar ranges of inductance as given above for the output isolation inductance $L_{ISO-1}$.

In other exemplary embodiments, the output isolation resistance $R_{ISO-1}$ is between about 0.1Ω and 10Ω. In yet other exemplary embodiments, the output isolation resistance $R_{ISO-1}$ is between about 10Ω and 20Ω. In further exemplary embodiments, the output isolation resistance $R_{ISO-1}$ is between about 20Ω and 30Ω. In still further exemplary embodiments, the output isolation resistance $R_{ISO-1}$ is between about 30Ω and 40Ω. The output isolation resistance $R_{ISO-1}$ is typically less than 40Ω. It is to be understood that in various embodiments, the input isolation resistance $R_{ISO-2}$ will have similar ranges of resistance as given above for the output isolation resistance $R_{ISO-1}$.

In other exemplary embodiments, the output isolation inductance $L_{ISO-1}$ is between about 0.1 nH and 0.5 nH. In yet other exemplary embodiments, the output isolation inductance $L_{ISO-1}$ is between about 0.5 nH and 1 nH. In further exemplary embodiments, the output isolation inductance $L_{ISO-1}$ is between about 1 nH and 2 nH. It is to be understood that in various embodiments, the input isolation inductance $L_{ISO-2}$ will have similar ranges of inductance as given above for the output isolation inductance $L_{ISO-1}$.

In regard to input and output signal frequency, exemplary embodiments are configured to operate at a given frequency from between about 1.8 GHz to 2.5 GHz. Other exemplary embodiments are configured to operate at a given frequency from between about 2.5 GHz to 3.8 GHz. Yet other exemplary embodiments are configured to operate at a given frequency from between about 3.8 GHz to 5 GHz, while still yet other exemplary embodiments are configured to operate at a given frequency of the output signal from between about 5 GHz to 6 GHz. Note that, throughout the remaining figures, the graph label $R_{ISO}$ applies to either of the output isolation resistance $R_{ISO-1}$ and the input isolation resistance $R_{ISO-2}$, while the graph label $L_{ISO}$ applies to either of the output isolation inductance $L_{ISO-1}$ and the input isolation inductance $L_{ISO-2}$.

Figure 3:
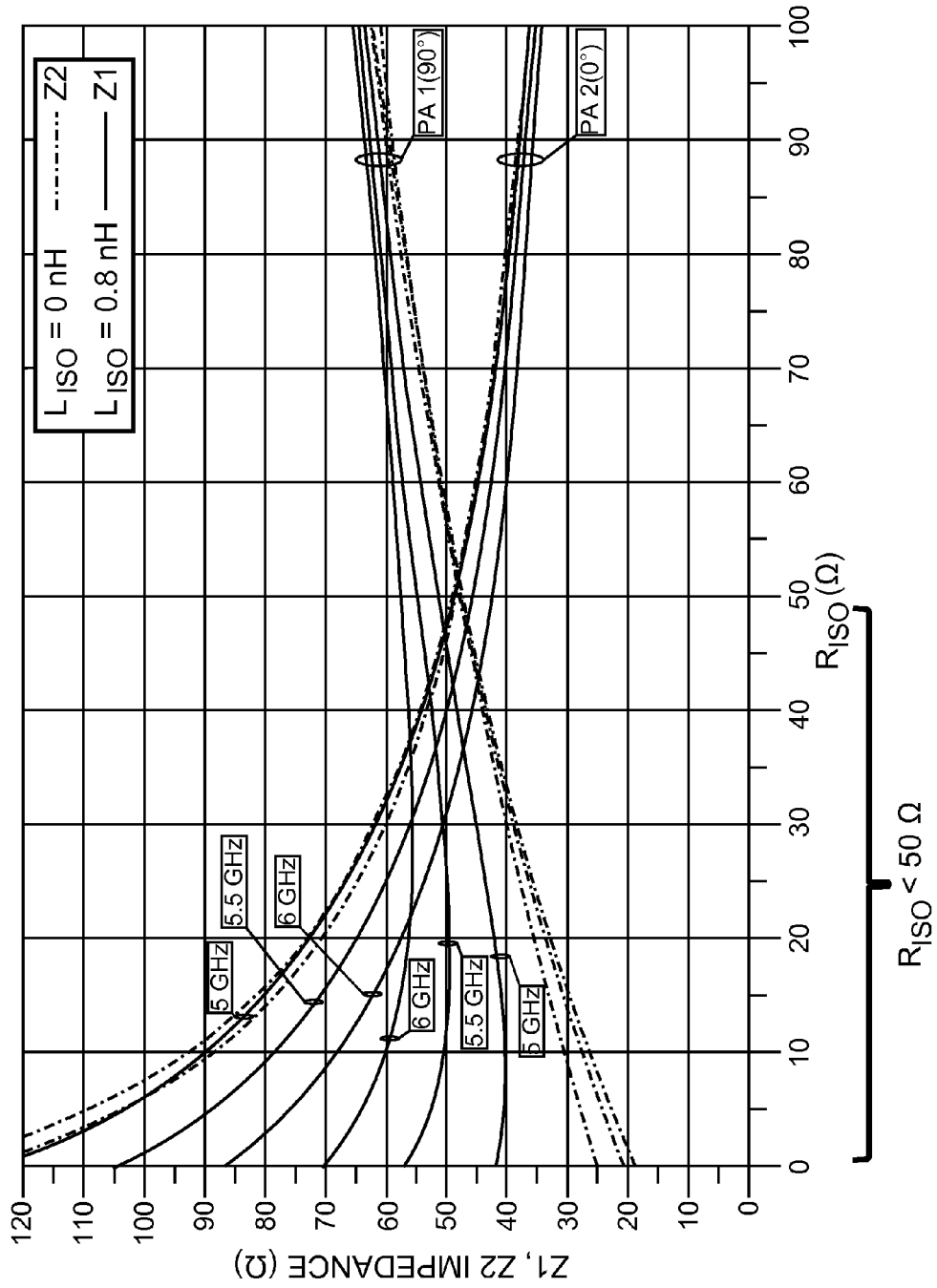
FIG. 3 is a graph depicting coupler impedance transformation characteristics for input ports of a quadrature coupler.

FIG. 3 is a graph depicting coupler impedance transformation characteristics for the 0° phase input port Z1 and the 90° phase input port Z2 of the second quadrature coupler 20 as a function of the output isolation resistance $R_{ISO-1}$ for two different cases of the output isolation inductance $L_{ISO-1}$ for various frequencies of 5 GHz, 5.5 GHz, and 6 GHz targeted towards 802.11 ac wireless fidelity (WiFi) PA applications.

The thin dot and dash curves show that there is relatively little frequency dependence when the output isolation inductance $L_{ISO-1}$=0 nH. However, with the output isolation inductance $L_{ISO-1}$=0.8 nH, the thick solid curves show that real impedance at the first PA 12 input and the second PA 14 input the 0° phase input port Z1 along with the 90° phase input port Z2 have a strong frequency dependent real impedance. This characteristic is more pronounced in the region where the output isolation resistance $R_{ISO-1}$ is less than the nominal 50Ω system impedance, and is therefore the reason for the restricted value range defined in this disclosure. In a range where the output isolation resistance $R_{ISO-1}$ is less than 50Ω, the load impedances of the first PA 12 and the second PA 14 are not symmetrical, and in fact have opposite tendencies versus frequency. For example, the 0° phase input port Z1 has a decreasing impedance versus frequency from ~90Ω to ~70Ω for the output isolation resistance $R_{ISO-1}$=10Ω. The first PA 12 on the other hand, varies from 40Ω to 60Ω as a function of frequency. These unbalanced dependencies in conjunction with phase unbalances may be utilized to compensate AM-AM and AM-PM performance over bandwidth. Generally, the second PA 14 will see slightly higher gain at lower contributed power levels at lower frequencies, while the first PA 12 will have approximately the same gain and power, wherein an overall combined amplifier will see the slightly higher gain at lower contributed power levels which may reduce AM-AM distortion.

Figure 4:
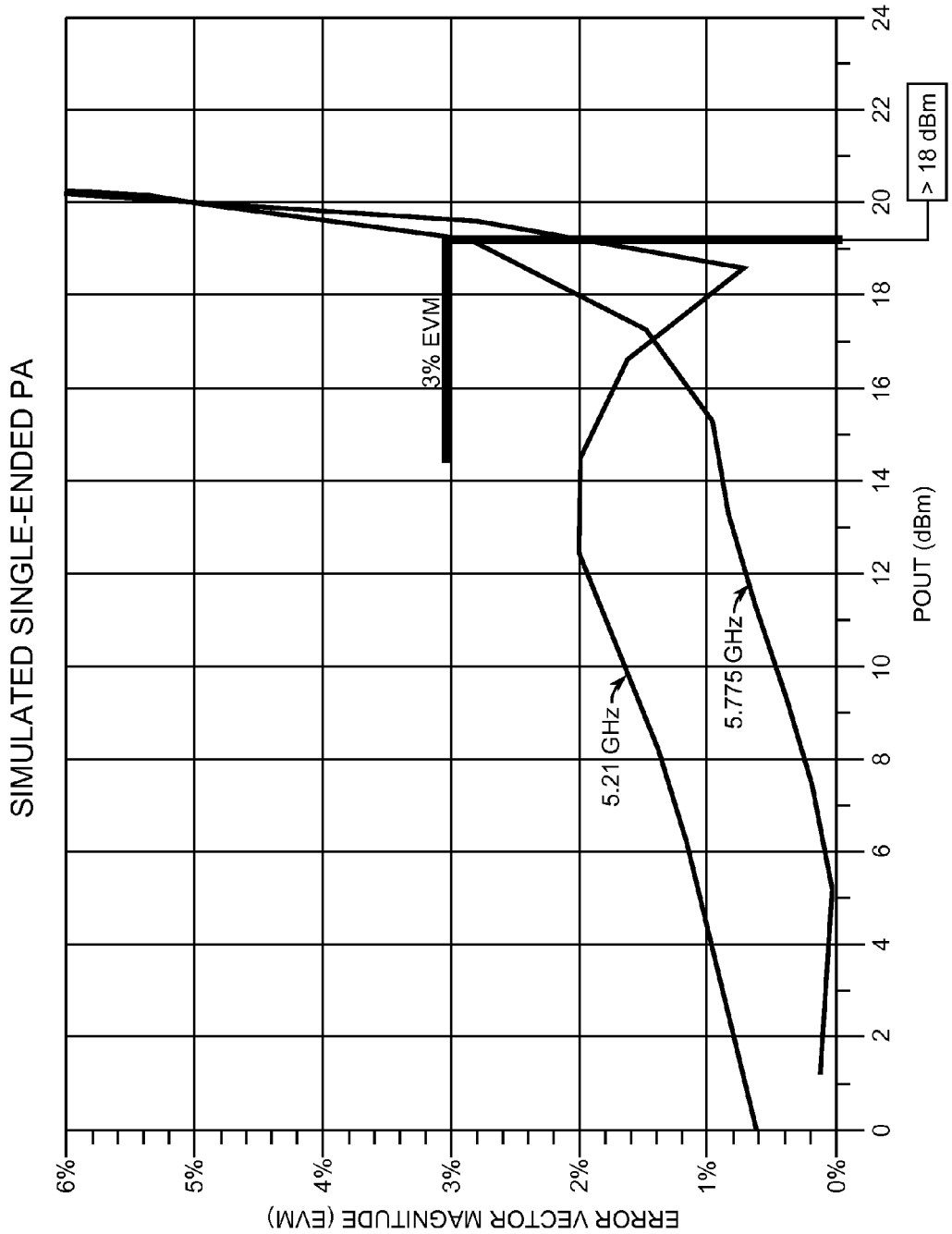
FIG. 4 is a graph depicting linear error vector magnitude (EVM) performance versus output power (POUT) for a related art single-ended PA.

FIG. 4 is a graph depicting linear error vector magnitude (EVM) performance versus output power (POUT) for a related art single-ended PA (not shown). In particular, FIG. 4 illustrates a simulated performance of a 3.3V indium gallium phosphide (InGaP) single-ended PA (not shown) which is used in a commercial 5 GHz WiFi front end module product (not shown). The single-ended PA obtains a linear POUT >18 dBm for a linear EVM of <3%. Note that the low-band and high-band characteristics are different. The low-band has an EVM hump around 14 dBm and is due to AM-AM distortion.

In order to meet a more stringent 802.11 ac EVM of <1.8%, the low-band AM-AM characteristics needs improvement. Referring back to the present embodiments depicted in FIG. 1 and FIG. 2, the value of the resistance of the output isolation resistance $R_{ISO-1}$ can be adjusted to improve the low-band AM-AM characteristics. If the low-band hump is resolved by adjusting the output isolation resistance $R_{ISO-1}$, then the high-band will limit the linear power level, which can be orthogonally maximized to a first order by adjusting the output isolation inductance $L_{ISO-1}$.

Figure 5:
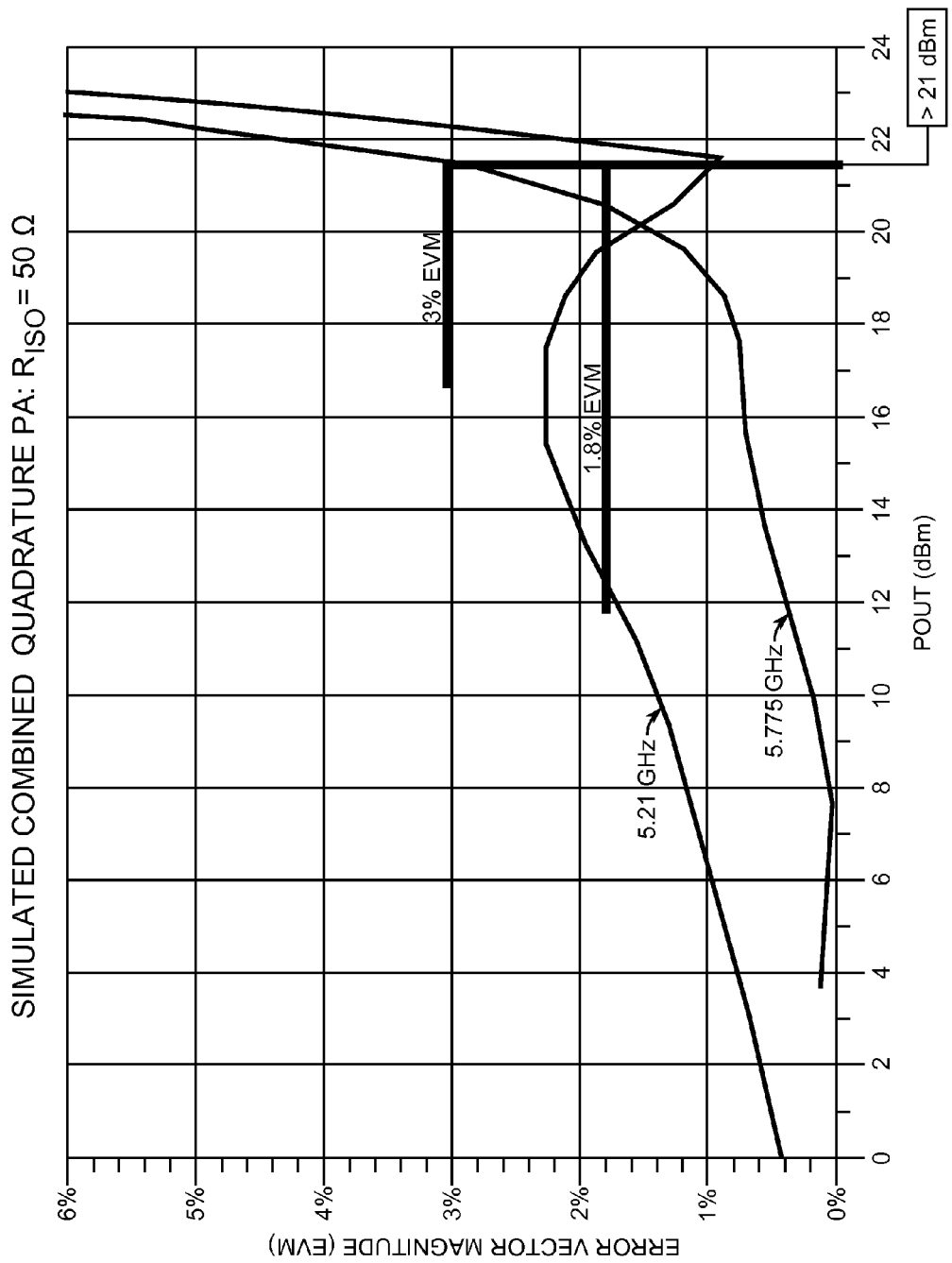
FIG. 5 is a graph depicting linear EVM performance versus POUT for a related art quadrature PA with an output isolation resistance of 50Ω.

FIG. 5 is a graph depicting linear EVM performance versus POUT for a related art quadrature PA (not shown) with the output isolation resistance $R_{ISO-1}$ of 50Ω. The graph of FIG. 5 illustrates the EVM-Pout performance when two PAs are combined using quadrature couplers at both the input and the output and using 50Ω termination impedances for the isolation ports of each of the quadrature couplers. The 3% EVM linear output power has increased to >21 dBm which is roughly double the 3% EVM linear power compared to a single-ended PA. The DC power is now doubled so the 3% linear efficiency and bandwidth has not significantly degraded. It should be noted that wirebond inductance parasitics have been incorporated in this two-way power combined performance. The wirebond parasitics have helped compensate for some of the combiner loss (~0.5 dB) but have also worsened the low-band (5.21 GHz) EVM hump characteristic which is as high as 2.4% at around 16 dBm, which is at least 0.4% degradation compared to the previously discussed single PA case for a more stringent 2% EVM linearity.

The hump in the EVM is often encountered in linear PA design and has been determined to be due to AM-AM distortion characteristics that are more pronounced at the low-band edge. The more stringent 802.11ac EVM linearity specification of <1.8% is illustrated. The present embodiments depicted in FIG. 1 and FIG. 2 double the linear power at the RF output port 22, and improve the EVM linearity, while preserving linear-power-bandwidth and efficiency. This translates to increasing linear output power by 3 dB while suppressing the EVM distortion by roughly 4.4 dB. In order to improve the linearity in comparison with a conventionally combined quadrature PA (not shown), the output tuning network 24 is adjusted on the output termination port Z4 of the first quadrature coupler 16 (FIGS. 1 and 2). Further improvement in linearity can be realized by adjusting the second tuning network 36 on the input isolation port P1.

Due to the nature of coupler impedance transformation characteristics, the second tuning network 36 and the output tuning network 24 can effectively tune and compensate AM-AM and AM-PM distortion for the second unbalanced linear power amplifier 34. In this case, the output isolation resistance $R_{ISO-1}$ and the input isolation resistance $R_{ISO-2}$ are less than 50Ω and greater than 0Ω. Outside of this range, the output isolation inductance $L_{ISO-1}$ and the input isolation inductance $L_{ISO-1}$ are not as effective in linearizing the balanced PA operation as suggested by the coupler impedance transformation characteristics of FIG. 3. In particular, effective compensation of AM-AM distortion typically occurs when the output isolation resistance $R_{ISO-1}$ and the input isolation resistance $R_{ISO-2}$ are less than 40Ω and greater than about 0.1Ω.

In consideration of the relatively challenging task of doubling the linear power for a given EVM distortion level of 3%, and then imposing an additional requirement to reduce the EVM distortion by 4.4 dB without compromising linear power bandwidth or efficiency, the embodiments of this disclosure demonstrate a unique and novel linear RF power combining apparatus. Note that in FIGS. 6-15, historical EVM curves are depicted with broken lines, whereas the currently simulated EVM curves are depicted with solid black lines.

Figure 6:
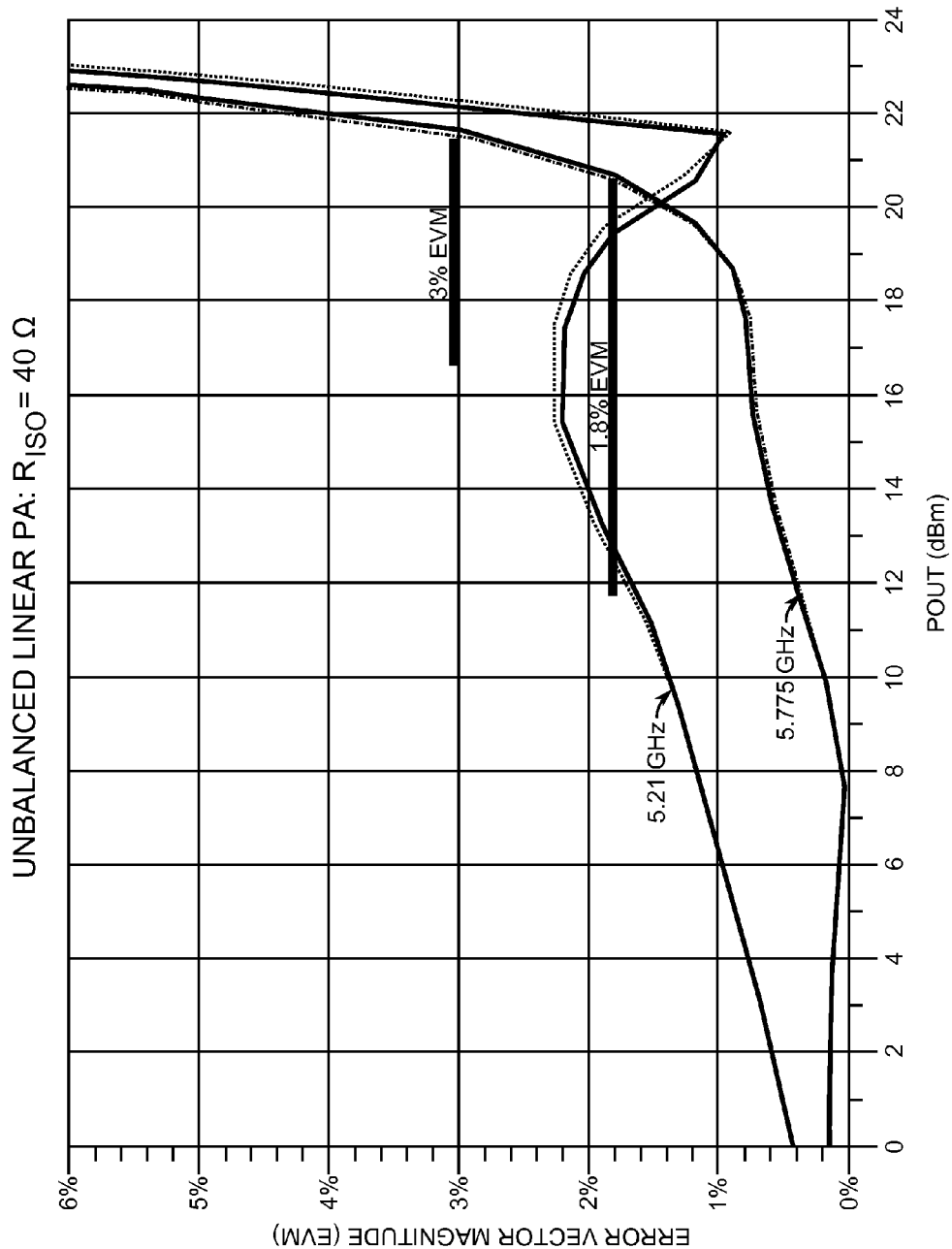
FIG. 6 is a graph depicting linear EVM performance versus POUT for an embodiment of an unbalanced linear PA with an output isolation resistance of 40Ω.

FIG. 6 is a graph depicting linear EVM performance versus POUT for an embodiment having the output isolation resistance $R_{ISO-1}$ fixed at 40Ω. In particular, the graph of FIG. 6 illustrates an impact of reducing the output isolation resistance $R_{ISO-1}$ to 40Ω, which shows a marginal improvement in the low-band (i.e., 5.21 GHz) EVM hump in that the EVM hump is lowered towards 1.8% EVM.

Figure 7:
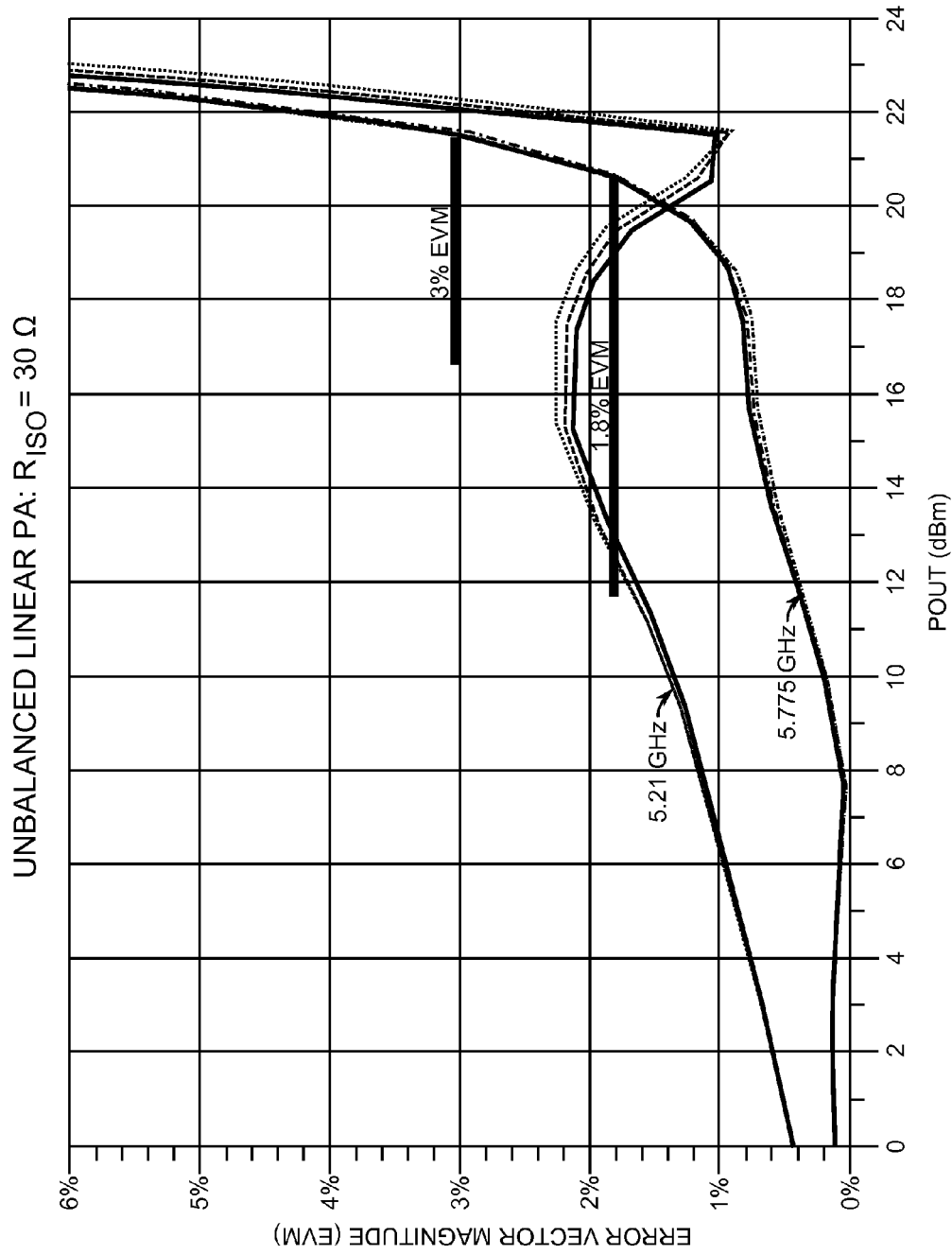
FIG. 7 is a graph depicting linear EVM performance versus POUT for an embodiment of an unbalanced linear PA with an output isolation resistance of 30Ω.

FIG. 7 is a graph depicting linear EVM performance versus POUT for an embodiment having the output isolation resistance $R_{ISO-1}$ fixed at 30Ω. In particular, the graph of FIG. 7 illustrates an impact of reducing the isolation resistance $R_{ISO-1}$ to 30Ω, which shows additional improvement in the low-band (5.21 GHz) EVM hump in that the EVM hump is further lowered towards 1.8% EVM.

Figure 8:
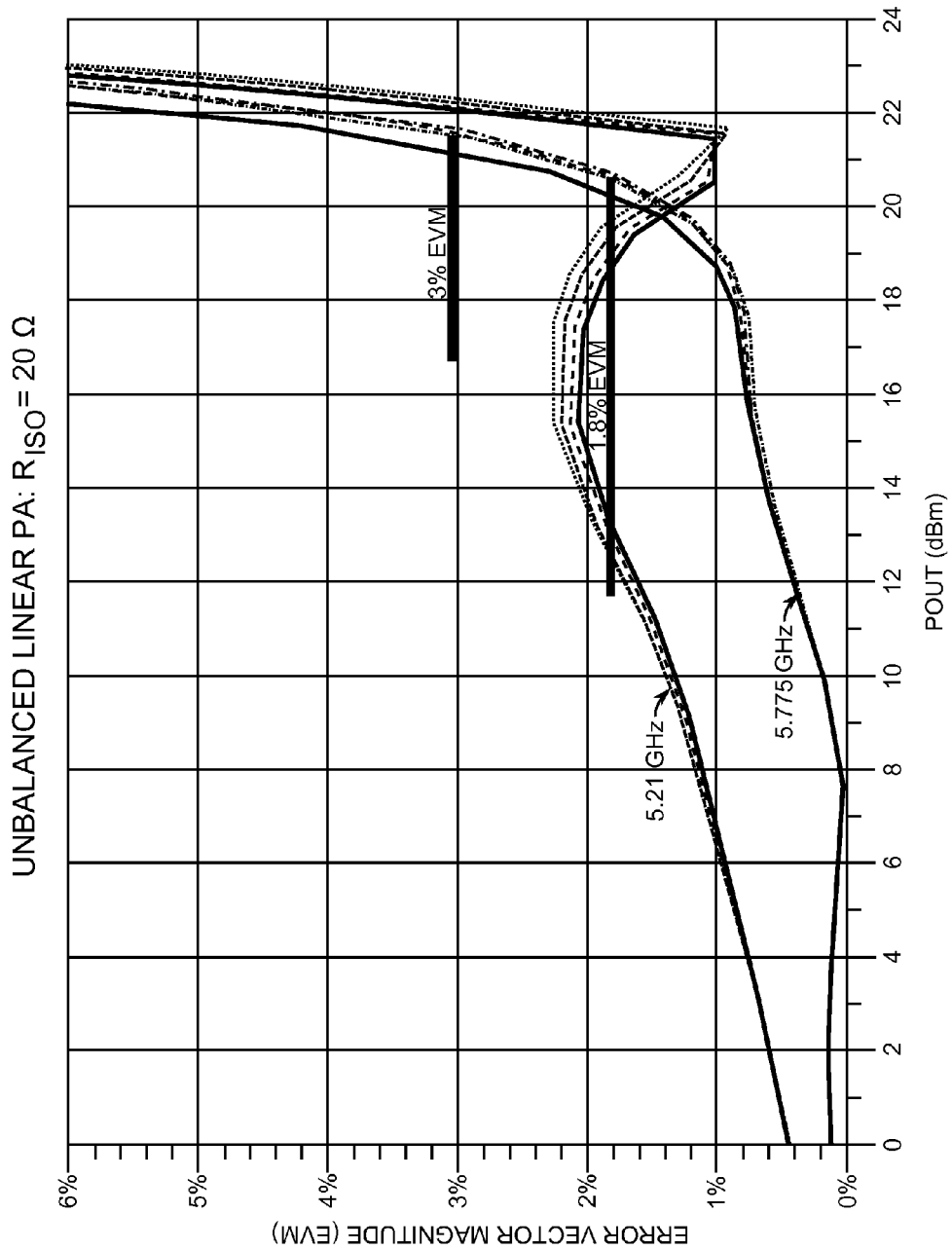
FIG. 8 is a graph depicting linear EVM performance versus POUT for an embodiment of an unbalanced linear PA with an output isolation resistance of 20Ω.

FIG. 8 is a graph depicting linear EVM performance versus POUT for an embodiment having the output isolation resistance $R_{ISO-1}$ fixed at 20Ω. In particular, the graph of FIG. 8 illustrates the impact on reducing the output isolation resistance $R_{ISO-1}$ to 20Ω, which shows further additional improvement in low-band (5.21 GHz) EVM hump in that the EVM hump is even further lowered towards 1.8% EVM. However, there is degradation in high power performance for the high-band (5.775 GHz) EVM which is moving to the left as the output isolation resistance $R_{ISO-1}$ is reduced.

Figure 9:
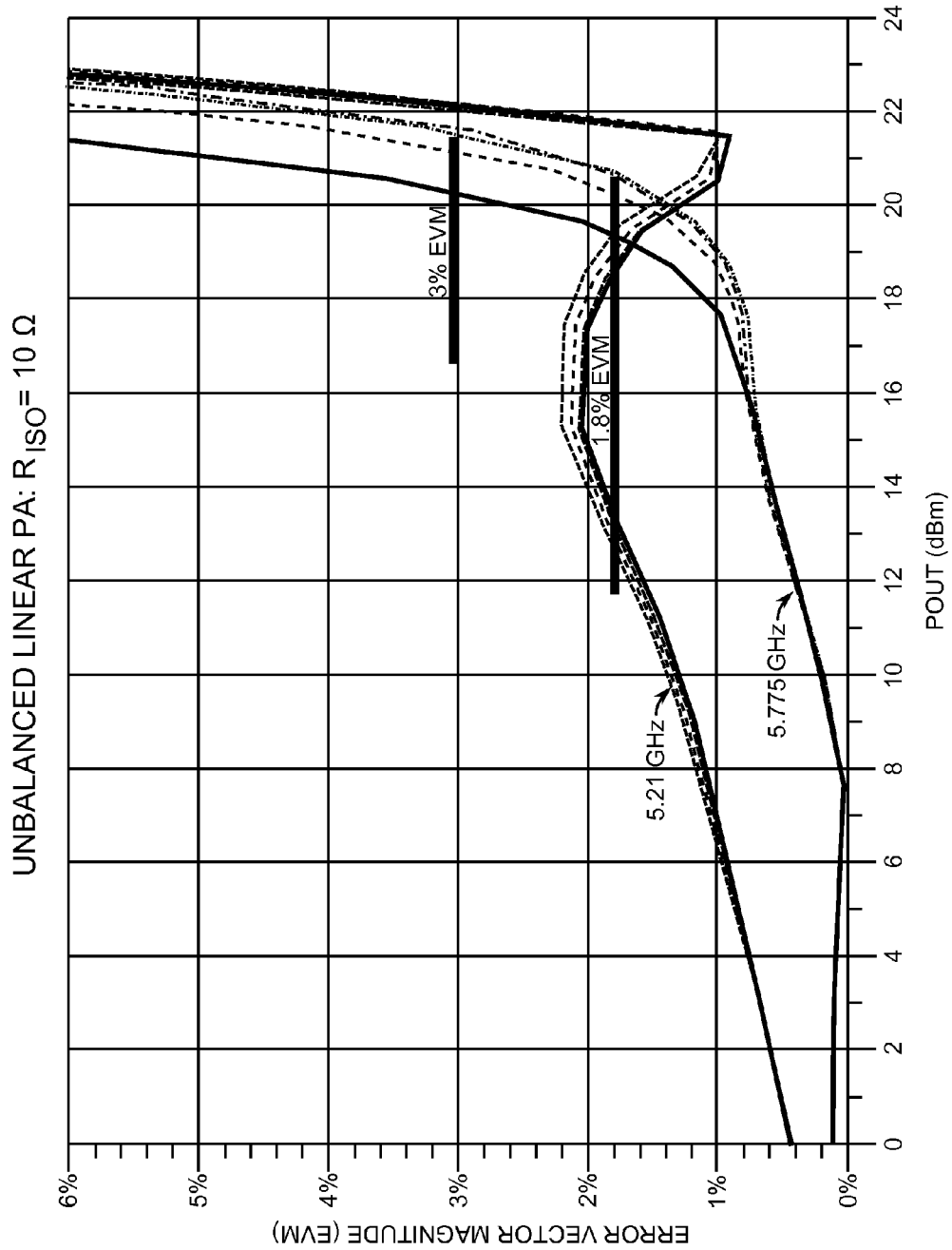
FIG. 9 is a graph depicting linear EVM performance versus POUT for an embodiment of an unbalanced linear PA with an output isolation resistance of 10Ω.

FIG. 9 is a graph depicting linear EVM performance versus POUT for an embodiment having the output isolation resistance $R_{ISO-1}$ fixed at 10Ω. The graph of FIG. 9 illustrates the impact of reducing the output isolation resistance $R_{ISO-1}$ to 10 ohms, which shows even further additional improvement in low-band (5.21 GHz) EVM hump. However, now there is significant degradation in high power in the high-band (5.775 GHz) EVM, which has moved to the left. While the low-band EVM hump is improving due to reduction in AM-AM distortion, the high-band EVM is starting to significantly degrade. This can be corrected by tuning the output isolation inductance $L_{ISO-1}$ in conjunction with the output isolation resistance $R_{ISO-1}$ to create a frequency dependent real impedance power amplifier load for the first PA 12 and the second PA 14, which helps reduce AM-AM distortion and EVM distortion.

Figure 10:
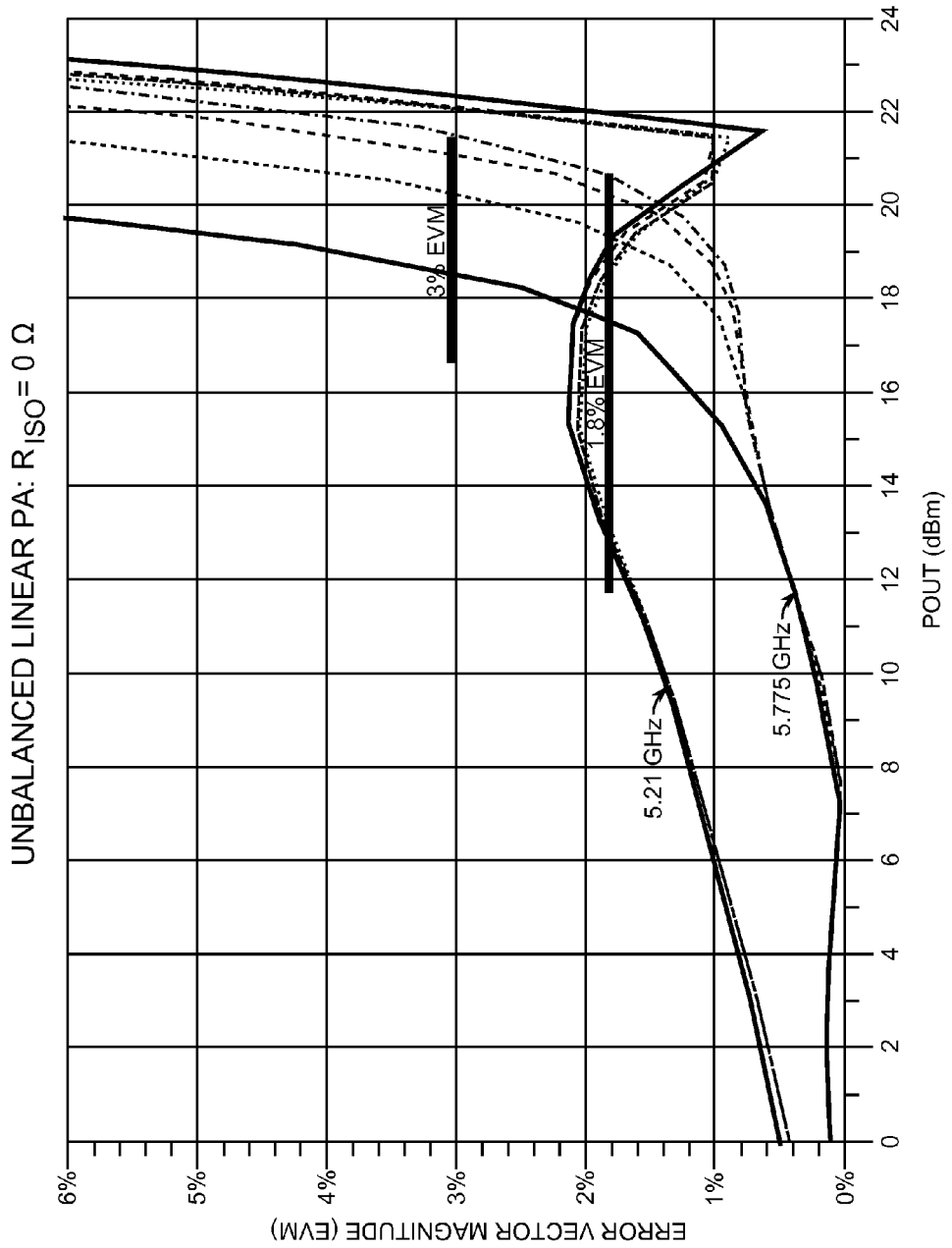
FIG. 10 is a graph depicting linear EVM performance versus POUT for an embodiment of an unbalanced linear PA with an output isolation resistance of 0Ω.

FIG. 10 is a graph depicting linear EVM performance versus POUT for an embodiment having the output isolation resistance fixed at 0Ω. In particular, the graph of FIG. 10 illustrates the impact of reducing the output isolation resistance $R_{ISO-1}$ to 0Ω, or a short circuit. In this case there is degradation the in low-band (5.21 GHz) EVM hump in that the EVM hump has moved away from 1.8% EVM. Also there is a relatively large degradation in high power performance for the high-band (5.775 GHz) EVM, which has significantly moved to the left. Thus, shorting the output isolation resistance $R_{ISO-1}$ is not conducive for improving linear performance due to a relatively large AM-AM distortion created by power reflection. Moreover, improving linear performance across a wide frequency bandwidth is not practical without the presence of the output isolation resistance $R_{ISO-1}$. Based on an analysis of the graphs presented in FIGS. 6-10, the output isolation resistance $R_{ISO-1}$ set at around 10Ω provides relatively good performance for the exemplary low-band (5.21 GHz) EVM and the exemplary high-band (5.775 GHz) EVM. However, it is to be understood that additional simulations for operation between other bands may indicate other output isolation resistance values. FIGS. 11-15 graphically illustrate an orthogonal tuning that is achievable by adjusting the output isolation inductance $L_{ISO-1}$, which can be a trimmable inductive transmission line or an adjustable wirebond.

Figure 11:
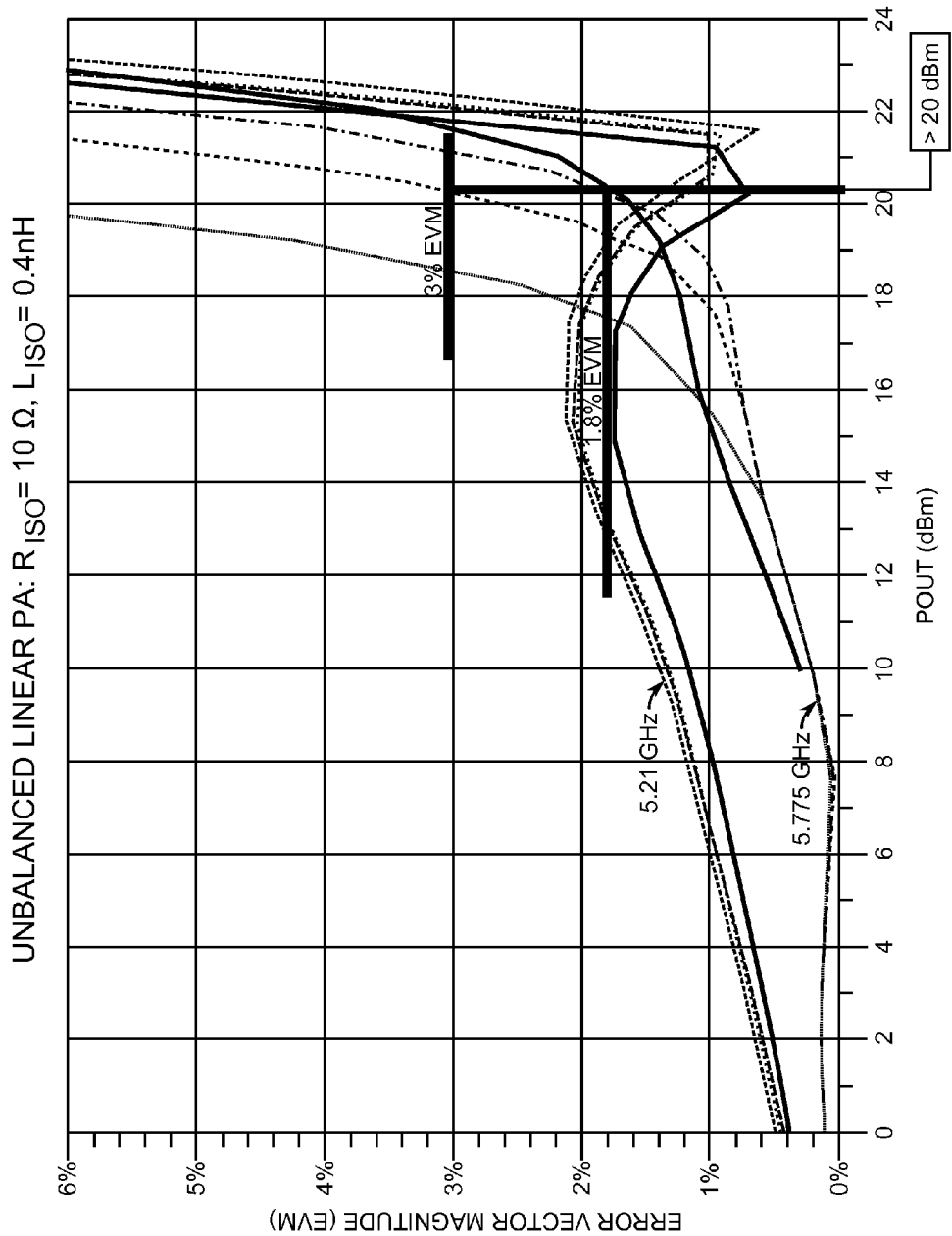
FIG. 11 is a graph depicting linear EVM performance versus POUT for an embodiment of an unbalanced linear PA with an output isolation resistance of 10Ω and an output isolation inductance of 0.4 nano-Henrys (nH).

FIG. 11 is a graph depicting linear EVM performance versus POUT for an embodiment having the output isolation resistance $R_{ISO-1}$ fixed at 10Ω and the output isolation inductance $L_{ISO-1}$ fixed at 0.4 nH. In particular, the graph of FIG. 11 illustrates the effect of the output isolation inductance $L_{ISO-1}=$ 0.4 nH in series with the output isolation resistance $R_{ISO-1}=$ 10Ω, which shows a significant reducing in low-band EVM hump as well as an improvement in the high power performance of the high-band EVM. Across the both the low-band and the high-band, linear power of >20 dBm is achieved for an EVM of <1.8%.

Figure 12:
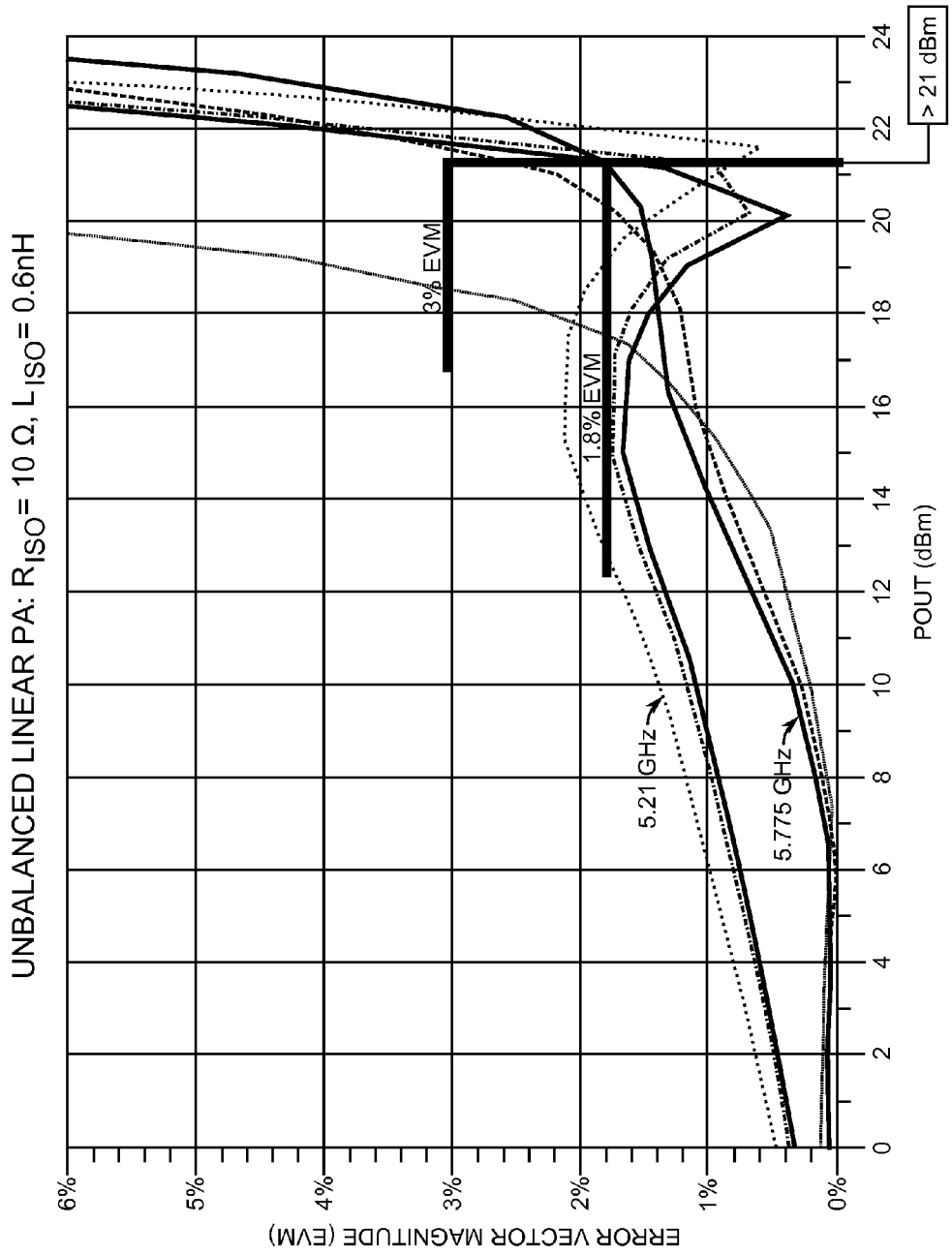
FIG. 12 is a graph depicting linear EVM performance versus POUT for an embodiment of an unbalanced linear PA with an output isolation resistance of 10Ω and an output isolation inductance of 0.6 nH.

FIG. 12 is a graph depicting linear EVM performance versus POUT for an embodiment having the output isolation resistance $R_{ISO-1}$ fixed at 10Ω and the output isolation inductance $L_{ISO-1}$ fixed at 0.6 nH. In particular, the graph of FIG. 11 illustrates the effect of the output isolation inductance $L_{ISO-1}=$ 0.6 nH in series with the output isolation resistance $R_{ISO-1}=$ 10Ω, which shows further significant reducing in the low-band EVM hump as well as an improvement in the high-power performance of the high-band EVM. Across both the low-band and the high-band, linear power of >21 dBm is achieved for an EVM of <1.8%.

Figure 13:
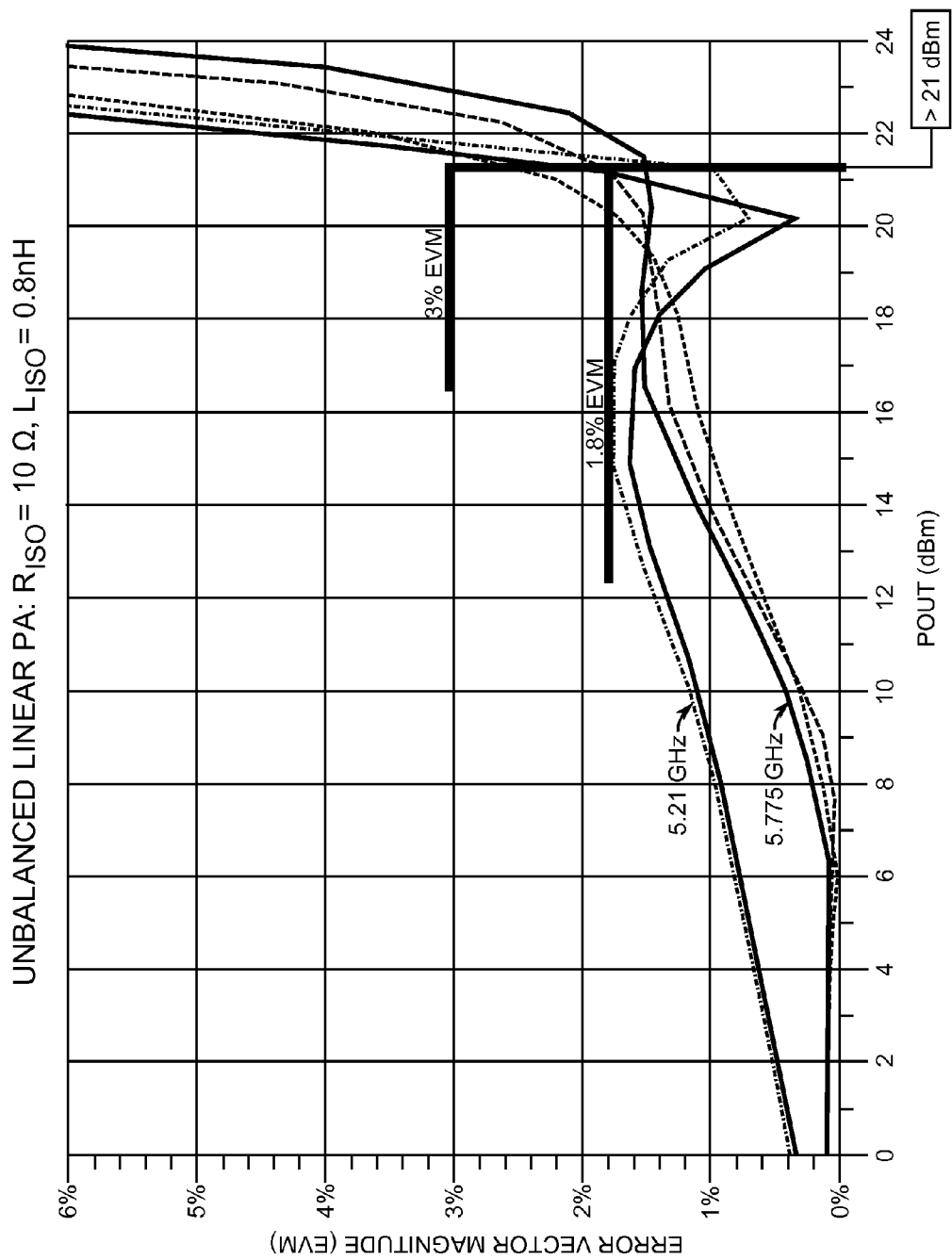
FIG. 13 is a graph depicting linear EVM performance versus POUT for an embodiment of an unbalanced linear PA with an output isolation resistance of 10Ω and an output isolation inductance of 0.8 nH.

FIG. 13 is a graph depicting linear EVM performance versus POUT for an embodiment having the output isolation resistance $R_{ISO-1}$ fixed at 10Ω and the output isolation inductance $L_{ISO-1}$ fixed at 0.8 nH. In particular, the graph of FIG. 11 illustrates the effect of the output isolation inductance $L_{ISO-1}$= 0.8 nH in series with the output isolation resistance $R_{ISO-1}$= 10Ω, which shows a further reducing in the low-band EVM hump but with negligible improvement in the high power performance of the high-band EVM. Across the both the low-band and the high-band, linear power of >21 dBm is achieved for an EVM of <1.8%.

Figure 14:
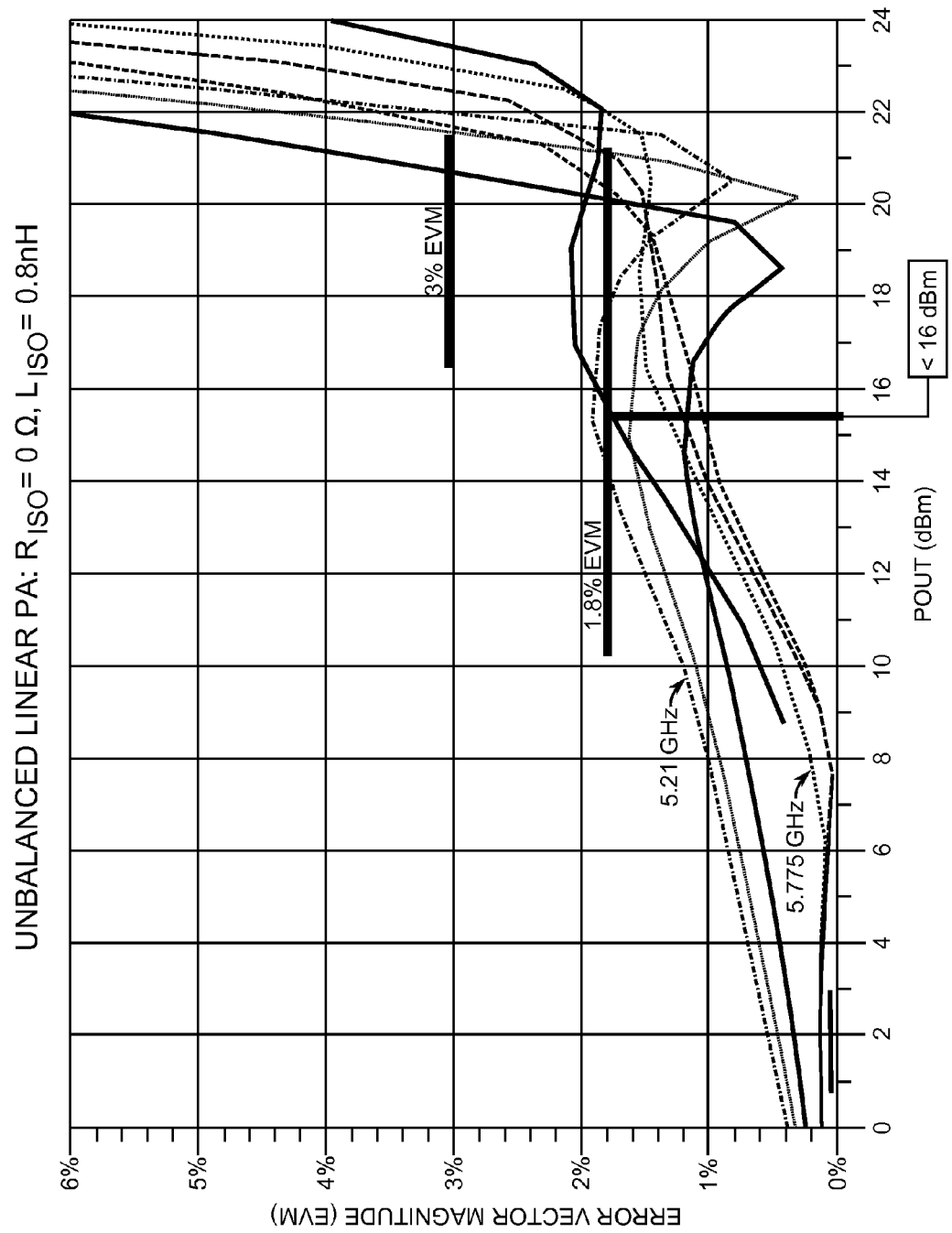
FIG. 14 is a graph depicting linear EVM performance versus POUT for an embodiment of an unbalanced linear PA with an output isolation resistance of 0Ω and an output isolation inductance of 0.8 nH.

FIG. 14 is a graph depicting linear EVM performance versus POUT for an embodiment having the output isolation resistance $R_{ISO-1}$ fixed at 0Ω and the output isolation inductance $L_{ISO-1}$ fixed at 0.8 nH. This is a special case in which a resistor providing the output isolation resistance $R_{ISO-1}$ is shorted or removed. As a result, the low-band EVM performance is degraded and exceeds 1.8%, while the high-band EVM performance is reduced to <16 dBm.

Figure 15:
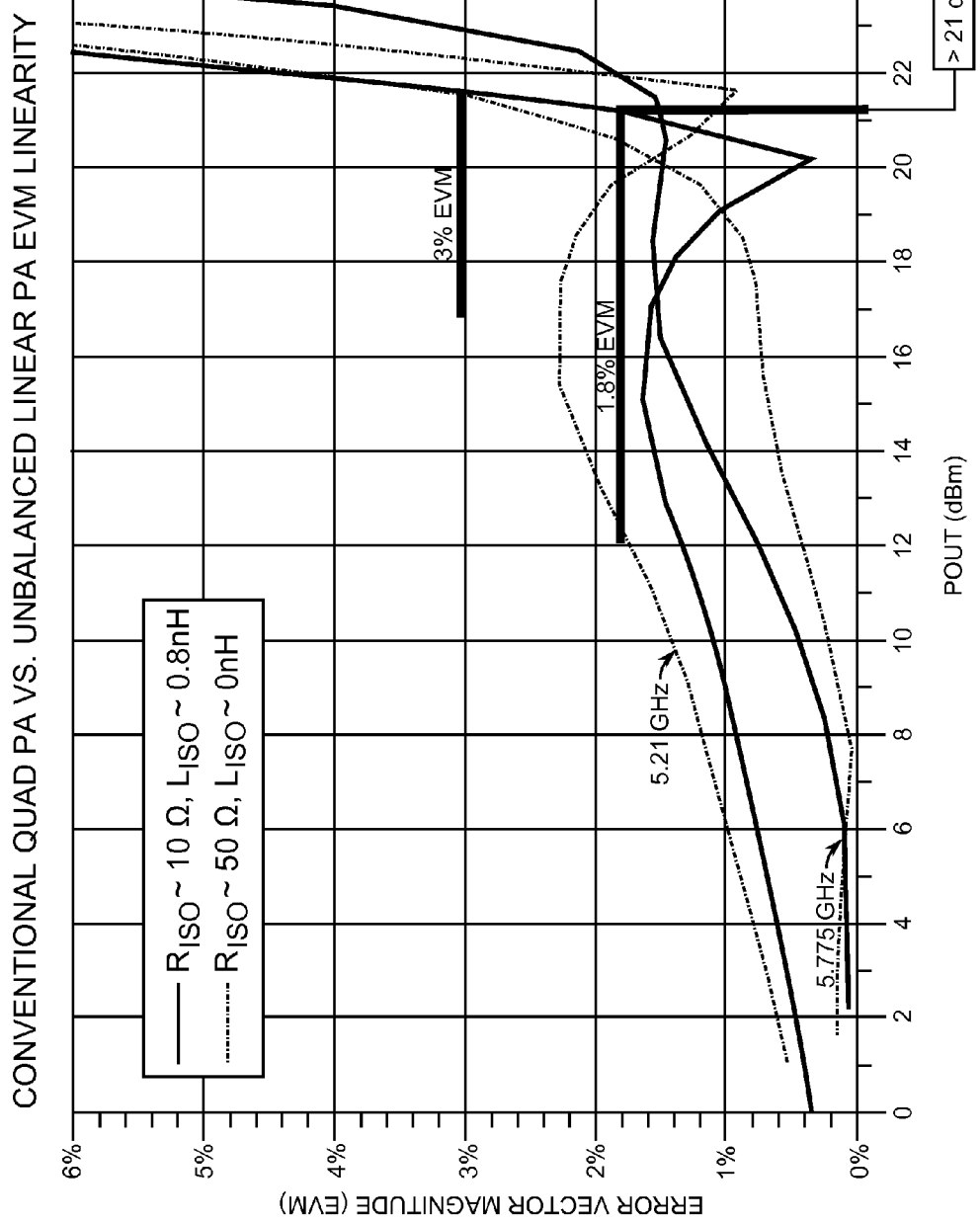
FIG. 15 is a graph depicting EVM versus POUT of a conventional quadrature PA in comparison with EVM versus POUT of an unbalanced linear PA embodiment.

FIG. 15 is a graph depicting EVM versus POUT of a conventional quadrature PA in comparison with EVM versus POUT of an embodiment of this disclosure. By appropriately adjusting the output isolation resistance $R_{ISO-1}$ and by appropriately adjusting the output isolation inductance $L_{ISO-1}$, an improvement from 3% EVM to 1.8% EVM is achievable for an output power level of ~21 dBm. This is essentially at least a 4.4 dB improvement in EVM linearity without compromising linear efficiency or bandwidth of operation.

Figure 16:
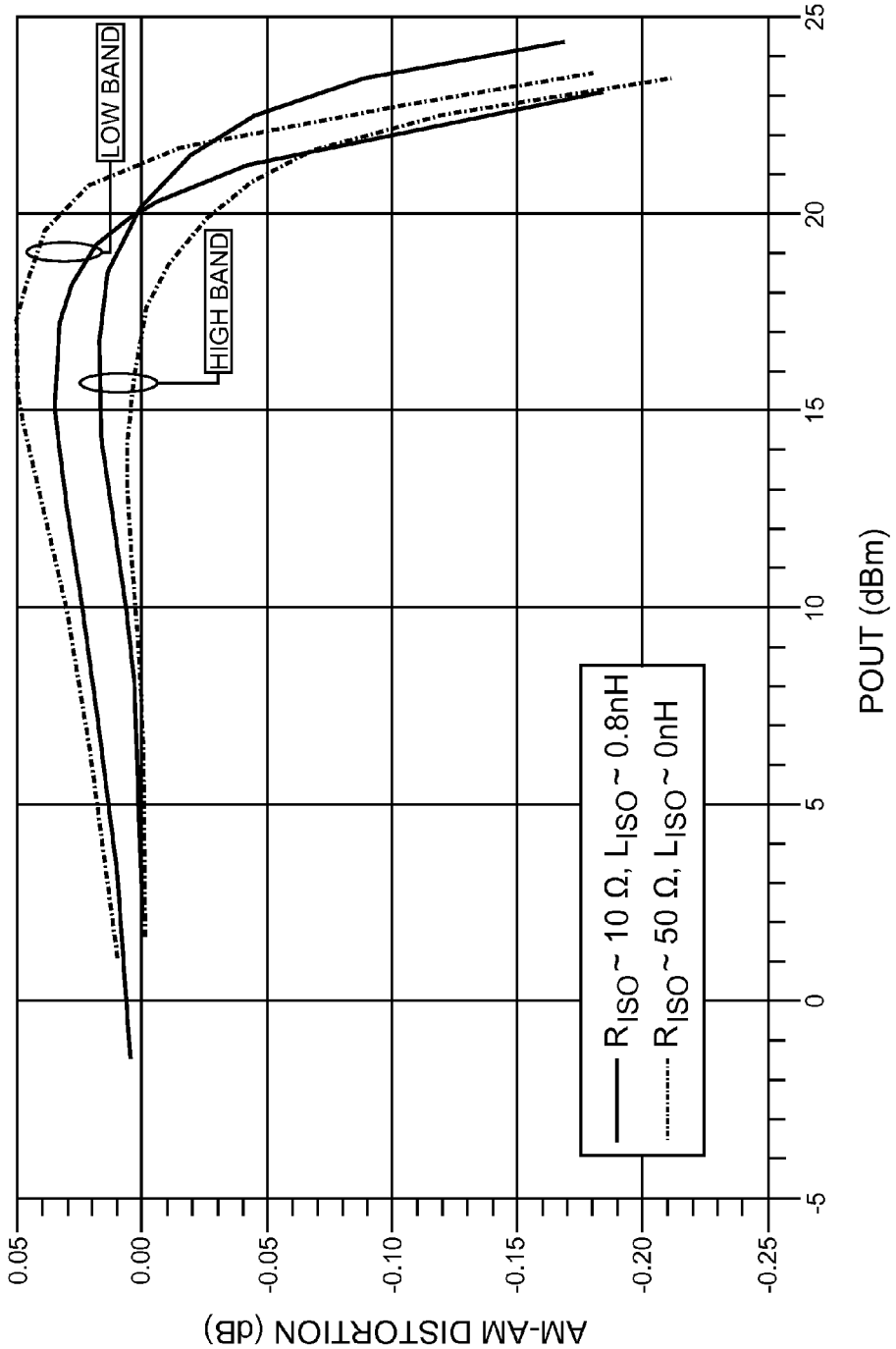
FIG. 16 is a graph depicting AM-AM distortion versus POUT of a conventional quadrature PA in comparison with AM-AM distortion versus POUT of an unbalanced linear PA embodiment.

FIG. 16 is a graph depicting AM-AM distortion versus POUT of a conventional quadrature PA in comparison with AM-AM distortion versus POUT of an unbalanced linear PA embodiment. In particular, the graph of FIG. 16 shows the improvement in low-band and high-band AM-AM characteristics of the present embodiments versus the conventional quadrature PA. A significant improvement in AM-AM characteristics is achieved across the low-band and the high-band.

Figure 17:
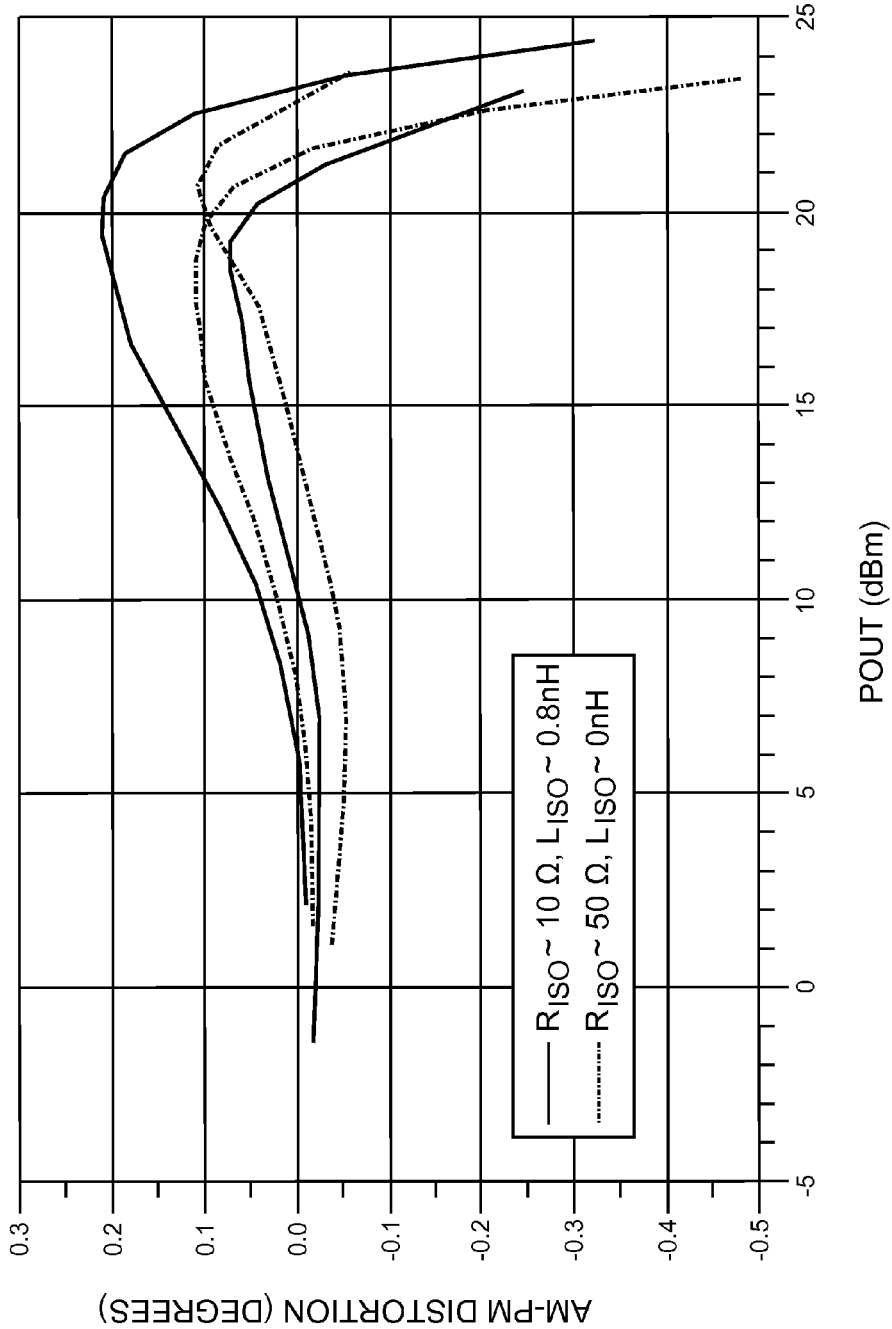
FIG. 17 is a graph depicting AM-PM distortion versus POUT of a conventional quadrature PA in comparison with AM-PM distortion versus POUT of an unbalanced linear PA embodiment.

FIG. 17 is a graph depicting AM-PM distortion versus POUT of a conventional quadrature PA in comparison with AM-PM distortion versus POUT of the present embodiments. In particular, the graph of FIG. 17 illustrates that the AM-PM distortion characteristics are improved as a result of the present embodiments. However, the AM-PM distortion does not have a significant impact on EVM linearity and that a relatively large share of the EVM distortion comes from AM-AM distortion. Also note that the sensitivity of the y-axis scale is 0.1 degree per division. Up to the 1.8% EVM power level of ~21 dBm, the AM-PM distortion is roughly <0.22%, which is relatively small.

The embodiments of this disclosure are applicable to various communications applications wherein it is desirable to double power and improve linearity over a wide modulation bandwidth to enable higher transmission data rates. Exemplary applications include, but are not limited to, infrastructure base station transceiver subsystems (BTSs), point-to-point backhaul radios, software defined radios, portable handset PAs, WiFi 802.11ac PAs, and cable television (CATV) power doublers.

Those skilled in the art will recognize improvements and modifications to the preferred embodiments of the present disclosure. All such improvements and modifications are considered within the scope of the concepts disclosed herein and the claims that follow.

What is claimed is:
1. An unbalanced linear power amplifier (PA) comprising:
a quadrature coupler having a 90° phase input port, a 0° phase input port, an output termination port, and a signal output port for providing an output signal, wherein each of the 90° phase input port, the 0° phase input port, the output termination port, and the signal output port have a characteristic impedance (Zo) comprising a characteristic resistance (Ro);
a first PA having an output coupled to the 90° phase input port of the quadrature coupler,
a second PA having an output coupled to the 0° phase input port of the quadrature coupler;
biasing circuitry configured to bias the first PA to provide a first gain and to bias the second PA to provide the first gain; and
a tuning network coupled between the output termination port and ground and comprising an isolation resistance in series with an isolation inductance, wherein the isolation resistance is between about 0.02*Ro Ω and 0.8*Ro Ω.

2. The unbalanced linear PA of claim 1 wherein the isolation resistance is between about 0.1Ω and 10Ω.

3. The unbalanced linear PA of claim 1 wherein the isolation resistance is between about 10Ω and 20Ω.

4. The unbalanced linear PA of claim 1 wherein the isolation resistance is between about 20Ω and 30Ω.

5. The unbalanced linear PA of claim 1 wherein the isolation resistance is between about 30Ω and 40Ω.

6. The unbalanced linear PA of claim 1 wherein the isolation inductance is between about 0.1 nH and 0.5 nH.

7. The unbalanced linear PA of claim 1 wherein the isolation inductance is between about 0.5 nH and 1 nH.

8. The unbalanced linear PA of claim 1 wherein the isolation inductance is between about 1 nH and 2 nH.

9. The unbalanced linear PA of claim 1 wherein the output signal has an error vector magnitude (EVM) of less than about 2.0%.

10. The unbalanced linear PA of claim 1 wherein the output signal has an EVM of less than about 1.8%.

11. The unbalanced linear PA of claim 1 wherein the first PA and the second PA are both biased for class A operation.

12. The unbalanced linear PA of claim 1 wherein the first PA and the second PA are both biased for class AB operation.

13. The unbalanced linear PA of claim 1 wherein the tuning network is dynamically tunable.

14. The unbalanced linear PA of claim 13 further including a controller for dynamically tuning the tuning network.

15. The unbalanced linear PA of claim 14 wherein the controller is further configured to dynamically adjust the tuning network to minimize AM-AM distortion of the output signal.

16. The unbalanced linear PA of claim 14 wherein the isolation resistance is provided by an isolation resistor with variable resistance and the controller is configured to dynamically adjust the variable resistance based upon a given frequency of the output signal.

17. The unbalanced linear PA of claim 14 wherein the isolation inductance is provided by an isolation inductor with variable inductance and the controller is configured to dynamically adjust the variable inductance based upon a given frequency of the output signal.

18. The unbalanced linear PA of claim 14 wherein the isolation resistance is provided by an isolation resistor with variable resistance and the isolation inductance is provided by an isolation inductor with variable inductance and the controller is configured to dynamically adjust both the variable resistance and the variable inductance based upon a given frequency of the output signal.

19. The unbalanced linear PA of claim 1 wherein the isolation resistance is fixed.

20. The unbalanced linear PA of claim 1 wherein the isolation inductance is fixed.

21. The unbalanced linear PA of claim 1 wherein the isolation resistance is fixed and the isolation inductance is fixed.

22. The unbalanced linear PA of claim 1 wherein the quadrature coupler is a Lange coupler.

23. The unbalanced linear PA of claim 1 wherein the output signal has a frequency between about 1.8 GHz and 2.5 GHz.

24. The unbalanced linear PA of claim 1 wherein the output signal has a frequency between about 2.5 GHz and 3.8 GHz.

25. The unbalanced linear PA of claim 1 wherein the output signal has a frequency between about 3.8 GHz and 5 GHz.

26. The unbalanced linear PA of claim 1 wherein the output signal has a frequency between about 5 GHz and 6 GHz.

27. The unbalanced linear PA of claim 1 further comprising a second quadrature coupler having a 0° phase output port coupled to an input port of the first PA, and a 90° phase output port coupled to an input port of the second PA, an input termination port, and a signal input port for receiving an input signal.

28. The unbalanced linear PA of claim 27 wherein a fixed isolation resistor is coupled between the input termination port and ground.

29. The unbalanced linear PA of claim 27 further comprising a second tuning network coupled between the input termination port and ground and comprising a second isolation inductance and a second isolation resistance in series with the second isolation inductance, wherein the second isolation resistance is between about 0.02*Ro Ω and 0.8*Ro Ω.

30. The unbalanced linear PA of claim 29 wherein the second tuning network is dynamically tunable by a controller that is configured to dynamically tune the second tuning network based upon a given frequency of the input signal.

31. The unbalanced linear PA of claim 27 wherein the second quadrature coupler is a Lange coupler.

32. The unbalanced linear PA of claim 1 wherein the characteristic resistance is between about 50Ω and 300Ω.

* * * * *